(12) United States Patent
Jung et al.

(10) Patent No.: US 9,035,296 B2
(45) Date of Patent: May 19, 2015

(54) THIN FILM TRANSISTOR, METHOD OF FABRICATING THE SAME, AND DISPLAY APPARATUS HAVING THE SAME

(71) Applicant: Samsung Display Co., Ltd., Yongin, Gyeonggi-do (KR)

(72) Inventors: Seohong Jung, Seoul (KR); Sun Hee Lee, Seoul (KR); Seung-Hwan Cho, Suwon-si (KR); Myounggeun Cha, Seoul (KR); Yoonho Khang, Yongin-si (KR); Youngki Shin, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 13/893,817

(22) Filed: May 14, 2013

(65) Prior Publication Data

US 2014/0191228 A1  Jul. 10, 2014

(30) Foreign Application Priority Data

Jan. 7, 2013 (KR) .................. 10-2013-0001699

(51) Int. Cl.
 *H01L 29/786* (2006.01)
(52) U.S. Cl.
 CPC ...... *H01L 29/78621* (2013.01); *H01L 29/7869* (2013.01)
(58) Field of Classification Search
 USPC ................ 257/43, 72, 59, 291, 292
 See application file for complete search history.

(56) References Cited

U.S. PATENT DOCUMENTS

| | | | |
|---|---|---|---|
| 7,994,510 B2 | 8/2011 | Jeong et al. | |
| 8,049,225 B2 | 11/2011 | Yamazaki et al. | |
| 8,154,024 B2 | 4/2012 | Iwasaki | |
| 8,183,097 B2 | 5/2012 | Kwak et al. | |
| 2008/0169469 A1* | 7/2008 | Kawamura et al. | 257/59 |
| 2011/0127525 A1* | 6/2011 | Yamazaki et al. | 257/43 |
| 2012/0003795 A1 | 1/2012 | Noda | |
| 2013/0256652 A1* | 10/2013 | Lee et al. | 257/43 |

FOREIGN PATENT DOCUMENTS

| | | |
|---|---|---|
| JP | 2010-199456 | 9/2010 |
| JP | 2010-243594 | 10/2010 |
| KR | 1020110054045 | 5/2011 |
| KR | 1020120062376 | 6/2012 |
| KR | 1020130111872 | 10/2013 |

OTHER PUBLICATIONS

US Publication No. 20130256652 corresponds to KR1020130111872.

* cited by examiner

*Primary Examiner* — Chuong A Luu
*Assistant Examiner* — Rodolfo Fortich
(74) *Attorney, Agent, or Firm* — F. Chau & Associates, LLC

(57) ABSTRACT

A thin film transistor includes a semiconductor layer disposed on a base substrate and including an oxide semiconductor material, a source electrode and a drain electrode, which respectively extend from opposing ends of the semiconductor layer, a plurality of low carrier concentration areas respectively disposed between the source electrode and the semiconductor layer and between the drain electrode and the semiconductor layer, a gate insulating layer disposed on the semiconductor layer, and a gate electrode disposed on the gate insulating layer.

15 Claims, 10 Drawing Sheets

THIN FILM TRANSISTOR, METHOD OF FABRICATING THE SAME, AND DISPLAY APPARATUS HAVING THE SAME

CROSS-REFERENCE TO RELATED APPLICATION

This application claims priority to Korean Patent Application No. 10-2013-0001699, filed on Jan. 7, 2013, the disclosure of which is hereby incorporated by reference herein in its entirety.

1. TECHNICAL FIELD

The present disclosure relates to a thin film transistor, a method of fabricating the same, and a display apparatus having the same. More particularly, the present disclosure relates to a thin film transistor including an oxide semiconductor material, a method of fabricating the thin film transistor, and a display apparatus having the thin film transistor.

2. DISCUSSION OF THE RELATED ART

A thin film transistor is widely applied to various flat panel displays, e.g., a liquid crystal display, an organic light emitting diode display, an electrophoretic display, etc., as a switching and driving device.

The thin film transistor includes, for example, a gate electrode connected to a gate line through which a scan signal passes, a source electrode connected to a data line through which a signal applied to a pixel electrode passes, a drain electrode facing the source electrode, and a semiconductor layer electrically connected to the source electrode and the drain electrode.

An operational property of the thin film transistor may depend on the semiconductor layer. The semiconductor layer may be formed of, for example, an amorphous silicon or a polysilicon material. The amorphous silicon semiconductor layer may be formed by a simple process, but with an amorphous silicon semiconductor layer it may be difficult to form a highly efficient thin film transistor therefrom as the charge carrier mobility of the amorphous silicon semiconductor layer may be very low. In addition, the polysilicon semiconductor layer has a high charge-carrier mobility, but the polysilicon semiconductor layer may require a curing process. Thus, manufacturing costs associated therewith may be high and a manufacturing process associated therewith may be complicated.

In recent years, a metal oxide semiconductor layer has been researched to address the above-mentioned difficulties of the amorphous semiconductor layer and the polysilicon semiconductor layer.

SUMMARY

Exemplary embodiments provide a thin film transistor including an oxide semiconductor material.

Exemplary embodiments provide a method of fabricating the thin film transistor.

Exemplary embodiments provide a display apparatus including the thin film transistor.

Exemplary embodiments of the present invention provide a thin film transistor including a semiconductor layer disposed on a base substrate and including an oxide semiconductor material, a source electrode and a drain electrode, which respectively extend from opposing ends of the semiconductor layer, a plurality of low carrier concentration areas respectively disposed between the source electrode and the semiconductor layer and between the drain electrode and the semiconductor layer, a gate insulating layer disposed on the semiconductor layer, and a gate electrode disposed on the gate insulating layer.

The source electrode, the drain electrode, and the low carrier concentration areas include a same material as a material of the semiconductor layer, and the oxide semiconductor material includes at least one of zinc, indium, gallium, tin, or a mixture thereof.

Each of the low carrier concentration areas has a width from about 0.5 μm to about 2 μm.

A carrier concentration of the low carrier concentration areas is higher than a carrier concentration of the semiconductor layer and lower than the source and drain electrodes. The carrier concentration of the low carrier concentration areas is in a range from about $10^{17}/cm^3$ to about $10^{18}/cm^3$, the carrier concentration of the semiconductor layer is no greater than about $10^{16}/cm^3$, and the carrier concentration of the source and the drain electrodes is in a range from about $10^{18}/cm^3$ to about $10^{19}/cm^3$.

Exemplary embodiments of the present invention provide a method of fabricating the thin film transistor provided as follows. An oxide semiconductor pattern including an oxide semiconductor material is formed on a base substrate, and a gate insulating layer is formed covering the oxide semiconductor pattern. A gate electrode is formed on the gate insulating layer and overlapping with the oxide semiconductor pattern, and a first plasma treatment is performed on first areas of the oxide semiconductor pattern which include opposing ends of the oxide semiconductor pattern to form a source electrode and a drain electrode. Then, a second plasma treatment is performed on second areas of the oxide semiconductor pattern, which are not overlapped with the gate electrode between the source electrode and the drain electrode, to form a plurality of low carrier concentration areas.

After the gate electrode is formed, a first patterning process is performed on the gate insulating layer exposing the first areas. After the source and drain electrodes are formed, a second patterning process is performed on the gate insulating layer exposing the second areas.

The forming of the gate electrode, the exposing of the first areas, and the forming of the source and drain electrodes are performed using a first photoresist pattern, and the exposing of the second areas and the forming of the low carrier concentration areas are performed using a second photoresist pattern.

The forming of the gate electrode, the exposing of the first areas, the forming of the source and drain electrodes, the exposing of the second areas, and the forming of the low carrier concentration areas are performed using a photoresist pattern having a thickness at a center portion thereof thicker than a thickness at opposing end portions thereof.

Exemplary embodiments of the present invention provide a display apparatus including a base substrate, a thin film transistor disposed on the base substrate, and a display device that makes contact with the thin film transistor. The thin film transistor includes a semiconductor layer disposed on the base substrate and including an oxide semiconductor material, a source electrode and a drain electrode, which respectively extend from opposing ends of the semiconductor layer, and a plurality of low carrier concentration areas respectively disposed between the source electrode and the semiconductor layer and between the drain electrode and the semiconductor layer.

The display apparatus further includes a gate insulating layer disposed on the semiconductor layer and a gate electrode disposed on the gate insulating layer.

The display device includes a first electrode making contact with the drain electrode, a second electrode facing the first electrode, and an optical layer interposed between the first electrode and the second electrode.

The display apparatus further includes a protection layer that covers the thin film transistor and includes a first contact hole exposing a portion of the source electrode and a second contact hole exposing a portion of the drain electrode and a data line disposed on the protection layer making contact with the source electrode through the first contact hole, and the first electrode makes contact with the drain electrode through the second contact hole.

The display apparatus further includes a data line extending from the source electrode, and the first electrode extends from the drain electrode. The display apparatus further includes a protection layer that covers the thin film transistor and exposes the first electrode.

The display apparatus further includes an insulating layer interposed between the base substrate and the thin film transistor.

According to an exemplary embodiment of the present invention, a display apparatus is provided. The display apparatus includes a base substrate, a thin film transistor disposed on the base substrate, a display device that makes contact with the thin film transistor, an insulating layer disposed between the base substrate and the thin film transistor. The thin film transistor includes a semiconductor layer disposed on the insulating layer and including an oxide semiconductor material, a source electrode and a drain electrode, which respectively extend from opposing ends of the semiconductor layer, a plurality of low carrier concentration areas respectively disposed between the source electrode and the semiconductor layer and between the drain electrode and the semiconductor layer, a data line connected to the source electrode, and a first electrode connected to the drain electrode. One end of the source electrode extends to and is connected to the data line and one end of the drain electrode extends to and is connected to the first electrode of the display device. The source electrode, the drain electrode, the low carrier concentrations areas, the semiconductor layer, the data line and the first electrode each include a same material as one another and are each disposed on a same layer as one another.

The display apparatus further includes a gate insulating layer disposed on the semiconductor layer, a gate electrode disposed on the gate insulating layer and overlapping with the semiconductor layer, and a protection layer disposed on the thin film transistor, and the protection layer exposes a portion of the first electrode.

According to the above, the thin film transistor of the display apparatus of exemplary embodiments of the present invention includes the semiconductor layer formed of the oxide semiconductor material and the low carrier concentration areas diminishing a significant change in the carrier concentration between the semiconductor layer and the source and drain electrodes SE and DE, to thereby increase the reliability thereof.

BRIEF DESCRIPTION OF THE DRAWINGS

Exemplary embodiments of the present invention can be understood in more detail from the following detailed description when considered in conjunction with the accompanying drawings in which.

DETAILED DESCRIPTION OF EXEMPLARY EMBODIMENTS

Figure 1:
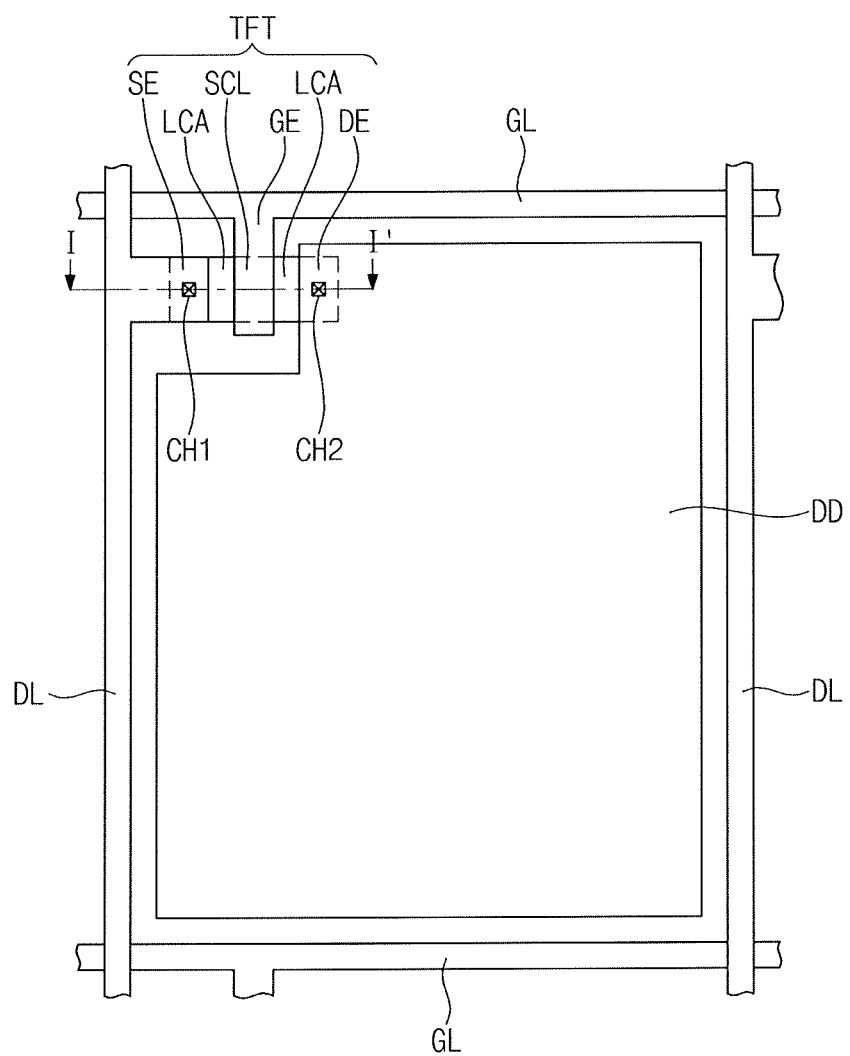
FIG. 1 is a plan view showing a display apparatus according to an exemplary embodiment of the present invention.

Hereinafter, exemplary embodiments of the present invention will be explained in detail with reference to the accompanying drawings.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Figure 2:
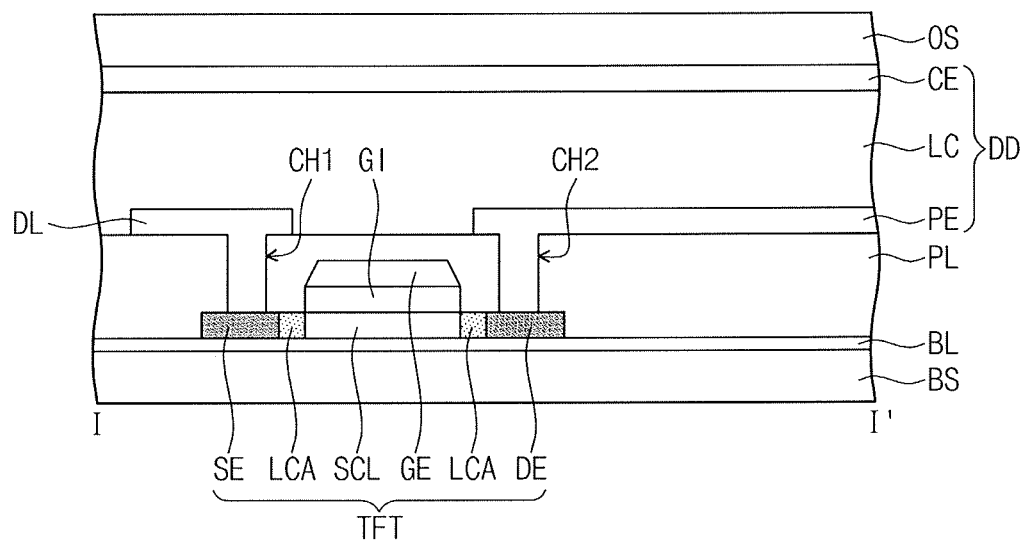
FIG. 2 is a cross-sectional view taken along a line I-I' of FIG. 1.

FIG. 1 is a plan view showing a display apparatus according to an exemplary embodiment of the present invention and FIG. 2 is a cross-sectional view taken along a line I-I' of FIG. 1.

Referring to FIGS. 1 and 2, a display apparatus includes, for example, a base substrate BS, a thin film transistor TFT disposed on the base substrate BS, and a display device DD making contact with the thin film transistor TFT.

The base substrate BS includes, for example, a transparent insulating material to transmit light. In addition, the base substrate BS may be, for example, a rigid type substrate, e.g., a glass substrate, a quartz substrate, a glass-ceramic substrate, a crystalline glass substrate, etc., or a flexible type substrate, e.g., a film substrate, a plastic substrate, etc., which are formed of a polymer organic material. For example, in an exemplary embodiment, the base substrate BS may be a flexible type substrate which includes polyethersulfone (PES), polyethylenenaphthalate (PEN), polyethylene (PE), polyimide (PI), polyvinyl chloride (PVC), or polyethylene terephthalate (PET). As a material for the base substrate BS, a material having, for example, a high temperature resistance (or a heat resistance) may be used during a manufacturing process.

An insulating layer BL is interposed between the base substrate BS and the thin film transistor TFT. The insulating layer BL includes, for example, at least one of a silicon oxide layer or a silicon nitride layer. The insulating layer BL prevents impurities from diffusing into the thin film transistor TFT and prevents moisture and oxygen from infiltrating into the thin film transistor TFT. In addition, the insulating layer BL planarizes a surface of the base substrate BS.

The thin film transistor TFT includes, for example, a semiconductor layer SCL, a gate electrode GE insulated from the semiconductor layer SCL and overlapped with the semiconductor layer SCL, a source electrode SE and a drain electrode DE, which are extended from both ends of the semiconductor layer SCL, and low carrier concentration areas LCA respectively interposed between the source electrode SE and the semiconductor layer SCL and between the drain electrode DE and the semiconductor layer SCL.

The semiconductor layer SCL is disposed on the insulating layer BL and includes, for example, an oxide semiconductor material. The oxide semiconductor material includes, for example, at least one of zinc (Zn), indium (In), gallium (Ga), tin (Sn), or a mixture thereof. For instance, the semiconductor layer SCL may include indium-gallium-zinc oxide (IGZO). Also, the semiconductor layer SCL may serve as a channel area of the thin film transistor TFT.

The source electrode SE, the drain electrode DE, and the low carrier concentration areas LCA are formed of, for example, the same material. In addition, the semiconductor layer SCL, the source electrode SE, the drain electrode DE, and the low carrier concentration areas LCA are disposed on the insulating layer BL.

The source electrode SE, the drain electrode DE, and the low carrier concentration areas LCA have, for example, a higher carrier concentration than a carrier concentration of the semiconductor layer SCL. Further, the source electrode SE and the drain electrode DE have, for example, a higher carrier concentration than a carrier concentration of the low carrier concentration areas LCA. For example, semiconductor layer SCL has a carrier concentration no greater than about $10^{16}/cm^3$, the low carrier concentration areas LCA have a carrier concentration from about $10^{17}/cm^3$ to about $10^{18}/cm^3$, and the source electrode SE and the drain electrode DE have a carrier concentration from about $10^{18}/cm^3$ to about $10^{19}/cm^3$.

Also, a width of the low carrier concentration areas LCA, that is, a distance between the source and drain electrodes SE and DE and the semiconductor layer SCL is in a range of, for example, from about 0.5 μm to about 2 μm.

Thus, the low carrier concentration areas LCA prevent the reliability of the thin film transistor TFT from being lowered due to a significant change in the carrier concentration between the semiconductor layer SCL and the source and drain electrodes SE and DE.

A gate insulating layer GI is disposed on the semiconductor layer SCL to insulate the semiconductor layer SCL from the gate electrode GE. The gate insulating layer GI includes, for example, at least one of a silicon oxide layer (SiOx), a silicon nitride layer (SiNx), an aluminum oxide layer (AlOx), a yttrium oxide layer ($Y_2O_3$), a hafnium oxide layer (HfOx), a zirconium oxide (ZrOx) layer, an aluminum nitride layer (AlN), an aluminum oxynitride layer (AlNO), a titanium oxide layer (TiOx), a barium titanate layer (BaTiO3), or a lead titanate layer ($PbTiO_3$). For instance, the gate insulating layer GI may include a double-layered structure of the silicon oxide layer and the silicon nitride layer.

The gate electrode GE is disposed on the gate insulating layer GI and overlapped with the semiconductor layer SCL. The gate electrode GE makes contact with a gate line GL that is extended in one direction. The gate electrode GE includes, for example, at least one of aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), gold (Au), cobalt (Co), palladium (Pd), zinc (Zn), niobium (Nb), vanadium (V), zirconium (Zr), hafnium (Hf), or alloys thereof.

A protection layer PL is disposed on the thin film transistor TFT. The protection layer PL includes at least one layer. For instance, the protection layer PL includes an inorganic protection layer and an organic protection layer disposed on the inorganic protection layer. The inorganic protection layer includes, for example, at least one of silicon oxide or silicon nitride. The organic protection layer includes, for example, one of acryl, polyimide, polyamide, and benzocyclobutene. That is, the organic protection layer is a planarization layer, which is transparent and flexible, and which may planarize an uneven surface structure thereunder.

The protection layer PL is provided with a first contact hole CH1 formed therethrough to expose a portion of the source electrode SE and a second contact hole CH2 formed therethrough to expose a portion of the drain electrode DE.

A data line DL is disposed on the protection layer PL to make contact with the source electrode SE through the first contact hole CH1 and the display device DD is disposed on the protection layer PL to make contact with the drain electrode DE through the second contact hole CH2.

The data line DL includes, for example, a transparent conductive oxide material, such as indium tin oxide (ITO), indium zinc oxide (IZO), aluminum doped ZnO (AZO), cadmium zinc oxide (CZO), indium gallium zinc oxide (IGZO), or a combination thereof. The data line DL is, for example, insulated from the gate line GL and extended in a direction different from the direction in which the gate line GL is extended. That is, the data line DL crosses the gate line GL.

The display device DD includes, for example, a first electrode PE, a second electrode CE facing the first electrode PE, and an optical layer LC interposed between the first electrode PE and the second electrode CE to transmit or generate light.

In addition, the display device DD may be, for example, a liquid crystal display (LCD) device, an electrophoretic display (EPD) device, an electrowetting display (EWD) device, or an organic light emitting display (OLED) device. In the present exemplary embodiment, for the convenience of explanation, the display device DD will be described an LCD device. Thus, the optical layer LC may be, for example, a liquid crystal layer. Although not shown in figures, the display device DD displays an image using light provided from a backlight unit.

The first electrode PE is disposed on the same layer as the data line DL and includes, for example, the same material as the material of the data line DL. That is, the first electrode PE is disposed on the protection layer PL and makes contact with the drain electrode DE through the second contact hole CH2. The first electrode PE includes, for example, a transparent conductive oxide material, such as ITO, IZO, AZO, CZO, IGZO, or a combination thereof.

The optical layer LC includes liquid crystal molecules. The liquid crystal molecules are aligned in a specific direction by an electric field formed between the first electrode PE and the second electrode CE to control a transmittance of light passing therethrough. Thus, the optical layer LC aligned by the electric field transmits the light provided from the backlight unit, so that the display device DD displays the image.

Similar to the first electrode PE, the second electrode CE includes, for example, the transparent conductive oxide material, such as ITO, IZO, AZO, CZO, IGZO, or a combination thereof. In addition, the second electrode CE receives a common voltage Vcom provided from an external source (not shown).

Meanwhile, the second electrode CE is disposed on a surface of an opposite substrate OS, which faces the base substrate BS.

In addition to the second electrode CE, the opposite substrate OS includes color filters (not shown) that display a predetermined color using the light provided from the backlight unit. Each color filter displays, for example, one of a red color, a green color, a blue color, a yellow color, and a white color, and the color filters are formed through a deposition process or a coating process.

The opposite substrate OS may be, for example, a rigid type substrate, e.g., a glass substrate, a quartz substrate, a glass-ceramic substrate, a crystalline glass substrate, etc., or a flexible type substrate, e.g., a film substrate, a plastic substrate, etc., which are formed of a polymer organic material. For example, in an exemplary embodiment, the opposite substrate OS may be a flexible type substrate which includes polyethersulfone (PES), polyethylenenaphthalate (PEN), polyethylene (PE), polyimide (PI), polyvinyl chloride (PVC), polyethylene terephthalate (PET), or a combination thereof. As a material for the opposite substrate OS, a material having, for example, a high temperature resistance (or a heat resistance) may be used during a manufacturing process.

The thin film transistor TFT of the display apparatus described above includes, for example, the semiconductor layer SCL formed of the oxide semiconductor material and the low carrier concentration areas LCA diminishing a significant change in the carrier concentration between the semiconductor layer SCL and the source and drain electrodes SE and DE, to thereby increase the reliability thereof.

Hereinafter, a manufacturing method of the display apparatus will be described in detail with reference to FIGS. 3 to 8.

FIGS. 3 to 8 are cross-sectional views showing a manufacturing method of the display apparatus of FIGS. 1 and 2.

Figure 3:
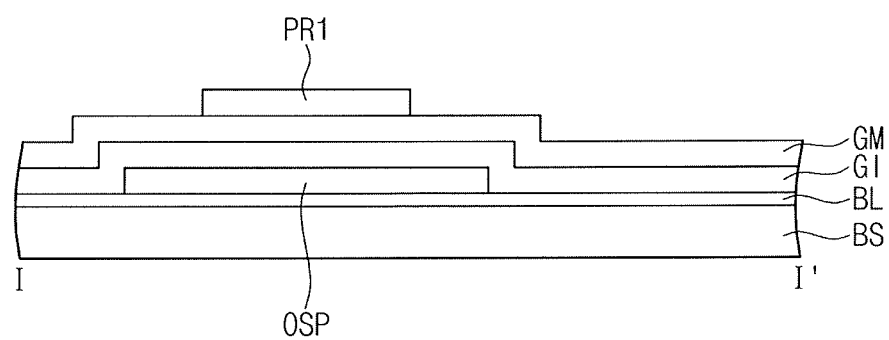
FIGS. 3 to 8 are cross-sectional views showing a manufacturing method of the display apparatus of FIGS. 1 and 2 according to an exemplary embodiment of the present invention.

Referring to FIG. 3, the insulating layer BL is formed on the base substrate BS.

The base substrate BS includes, for example, a transparent insulating material that transmits the light. The base substrate BS may be, for example, a rigid type substrate or a flexible type substrate.

The insulating layer BL includes, for example, at least one of a silicon oxide layer or a silicon nitride layer. The insulating layer BL prevents impurities, which are generated during the manufacturing process of the base substrate BS, from diffusing into an upper portion of the insulating layer BL and prevents moisture and oxygen from infiltrating into the upper portion of the insulating layer BL. In addition, the insulating layer BL planarizes the surface of the base substrate BS.

After the insulating layer BL is formed, the oxide semiconductor material is deposited on the insulating layer BL and patterned to form an oxide semiconductor pattern OSP. The oxide semiconductor material includes, for example, at least one of zinc (Zn), indium (In), gallium (Ga), tin (Sn), or mixtures thereof. The oxide semiconductor pattern OSP has, for example, a carrier concentration no greater than about $10^{16}/cm^3$.

After the oxide semiconductor pattern OSP is formed, the gate insulating layer GI is formed to cover the oxide semiconductor pattern OSP. The gate insulating layer GI includes, for example, at least one of the silicon oxide layer or the silicon nitride layer. For instance, the gate insulating layer GI may include a double-layered structure of the silicon oxide layer and the silicon nitride layer.

After the gate insulating layer GI is formed, a gate metal layer GM is formed on the gate insulating layer GI using a conductive metal material. The gate metal layer GM includes, for example, at least one of aluminum (Al), an aluminum alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), gold (Au), cobalt (Co), palladium (Pd), zinc (Zn), niobium (Nb), vanadium (V), zirconium (Zr), hafnium (Hf), or alloys thereof.

After the gate metal layer GM is formed, a first photoresist pattern PR1 partially overlapped with the oxide semiconductor pattern OSP is formed on the gate metal layer GM.

Figure 4:
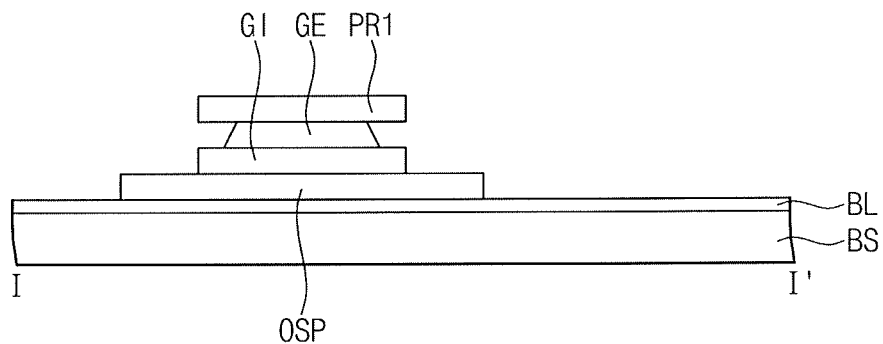

Referring to FIG. 4, after the first photoresist pattern PR1 is formed, the gate metal layer GM is, for example, wet-etched using the first photoresist pattern PR1 as a mask to form the gate electrode GE. The wet-etching process is, for example, an isotropic etching process, and the gate electrode GE has, for example, a size smaller than a size of the first photoresist pattern PR1.

After the gate electrode GE is formed, the gate insulating layer GI is firstly patterned using, for example, the first photoresist pattern PR1 as a mask. The first patterning process is performed using, for example, a dry-etching process. In addition, both ends areas (hereinafter, referred to as first areas) of the oxide semiconductor pattern OSP are exposed by the first patterning process. The dry-etching process is, for example, an anisotropic etching process, and the gate insulating layer GI has, for example, the same shape as the shape of the first photoresist pattern PR1. That is, the gate insulating layer GI has, for example, a size greater than a size of the gate electrode GE.

Figure 5:
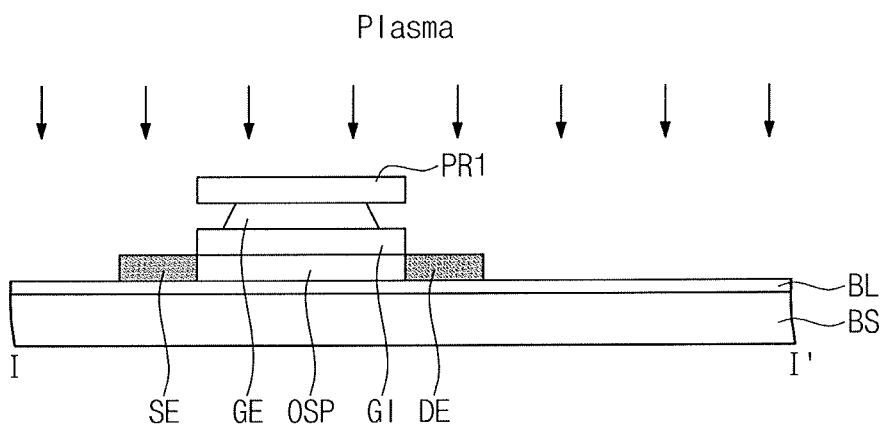

Referring to FIG. 5, after the first patterning process, the first areas are, for example, firstly plasma treated. The carrier concentration of the first areas increases to be within a range of, for example, from about $10^{18}/cm^3$ to about $10^{19}/cm^3$. Thus, the first areas are converted to the source electrode SE and the drain electrode DE by the first plasma treatment. In addition, the oxide semiconductor pattern OSP decreases and remains in an area between the source electrode SE and the drain electrode DE.

Figure 6:
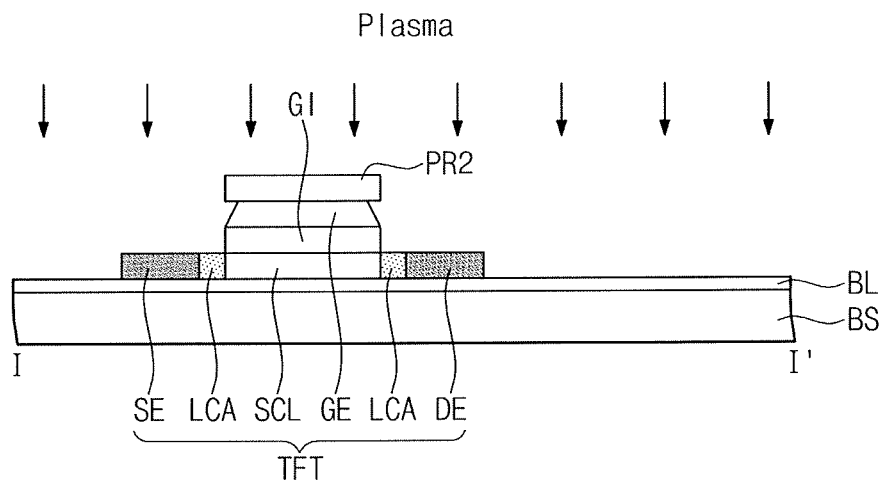

Referring to FIG. 6, after the first plasma treatment, the first photoresist pattern PR1 is removed and a second photoresist pattern PR2 is formed on the gate electrode GE to partially overlap with the gate electrode GE. The second photoresist pattern PR2 has, for example, the same size as the size of the gate electrode GE.

After the second photoresist pattern PR2 is formed, the gate insulating layer GI is secondly patterned using, for example, the second photoresist pattern PR2 as a mask. The second patterning process is performed using, for example, a dry-etching process. The dry-etching process is, for example, an anisotropic etching process, and the gate insulating layer GI has, for example, the same shape as the shape of the gate electrode GE and the second photoresist pattern PR2 after the second patterning process. That is, the size of the gate insulating layer GI is, for example, the same as the size of the gate electrode GE. Thus, areas (hereinafter, referred to as second areas) of the oxide semiconductor pattern OSP, which are not overlapped with the gate electrode GE between the source electrode SE and the drain electrode DE, are exposed by the second patterning process.

After the second patterning process, the source electrode SE, the drain electrode DE, and the second areas are, for example, secondly plasma treated. A carrier concentration of the second areas increases by the second plasma treatment. The carrier concentration of the second areas is lower than the carrier concentration of the source electrode SE and the drain electrode DE, and the carrier concentration of the second areas is in a range of, for example, from about $10^{17}/cm^3$ to about $10^{18}/cm^3$. Thus, the second areas are converted to the low carrier concentration areas LCA by the second plasma treatment. In addition, the semiconductor layer SCL is defined as an area between the low carrier concentration areas LCA.

The width of the low carrier concentration areas LCA, that is, the distance between the source and drain electrodes SE and DE and the semiconductor layer SCL is in the range of, for example from about 0.5 µm to about 2 µm.

Thus, the thin film transistor TFT, which includes the semiconductor layer SCL, the source electrode SE and the drain electrode DE extended from both ends of the semiconductor layer SCL, the low carrier concentration areas LCA disposed between the source electrode SE and the semiconductor layer SCL and between the drain electrode DE and the semiconductor layer SCL, and the gate electrode GE insulated from the semiconductor layer SCL and overlapped with the semiconductor layer SCL, is formed.

After the second plasma treatment, the second photoresist pattern PR2 is removed.

Figure 7:
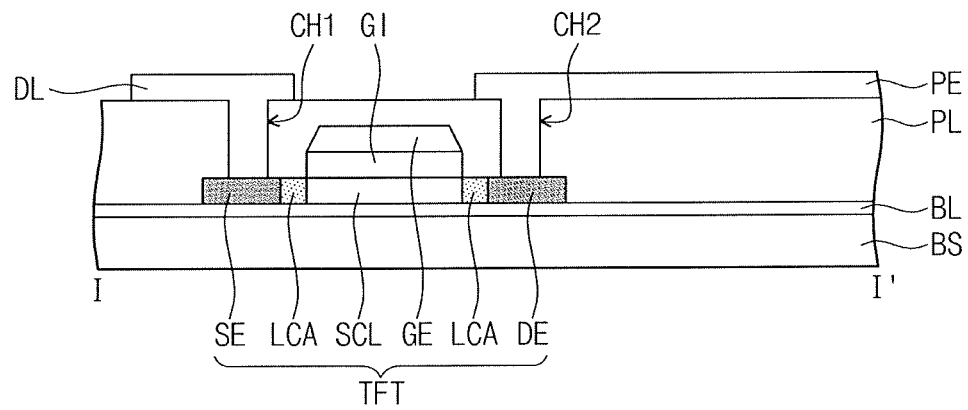

Referring to FIG. 7, after the second photoresist pattern PR2 is removed, the protection layer PL is formed to cover the thin film transistor TFT.

The protection layer PL includes at least one layer. For instance, the protection layer PL includes an inorganic protection layer and an organic protection layer disposed on the inorganic protection layer. The inorganic protection layer includes, for example, at least one of a silicon oxide layer or a silicon nitride layer. In addition, the organic protection layer includes, for example, one of acryl, polyimide, polyamide, and benzocyclobutene. That is, the organic protection layer is a planarization layer, which is transparent and flexible, and which may planarize an uneven surface structure thereunder.

After the protection layer PL is formed, the protection layer PL is patterned to form the first contact hole CH1 to expose a portion of the source electrode SE and the second contact hole CH2 to expose a portion of the drain electrode DE.

After the first contact hole CH1 and the second contact hole CH2 are formed, the transparent conductive oxide material including, for example, indium tin oxide (ITO), indium zinc oxide (IZO), aluminum doped ZnO (AZO), cadmium zinc oxide (CZO), indium gallium zinc oxide (IGZO), or a combination thereof is deposited on the protection layer PL and patterned to form the data line DL and the first electrode PE. The data line DL makes contact with the source electrode SE through the first contact hole CH1. The first electrode PE makes contact with the drain electrode DE through the second contact hole CH2.

Figure 8:
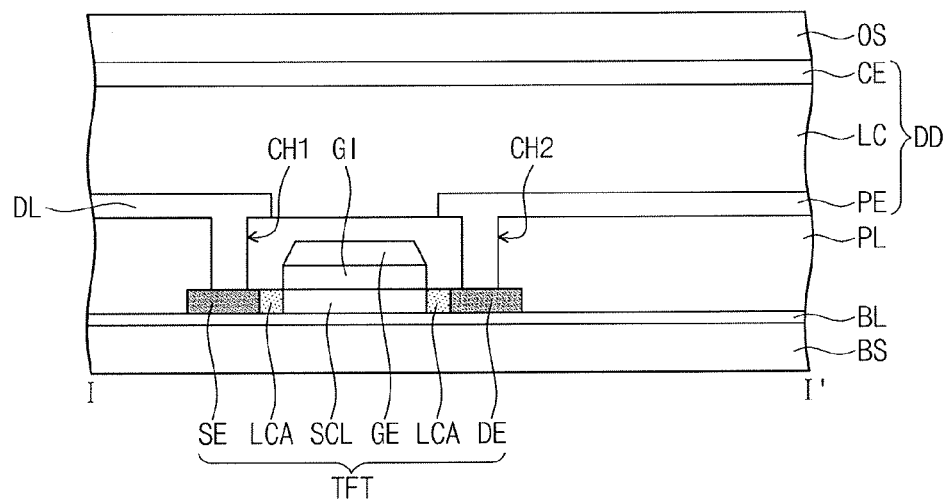

Referring to FIG. 8, after the data line DL and the first electrode PE are formed, the optical layer LC including the liquid crystal molecules is disposed on the data line DL and the first electrode PE.

After the optical layer LC is disposed, the opposite substrate OS is disposed on the optical layer LC. The opposite substrate OS includes, for example, the second electrode CE disposed on the surface thereof to face the first electrode PE. Similar to the first electrode PE, the second electrode CE includes, for example, a transparent conductive oxide material including, for example, indium tin oxide (ITO), indium zinc oxide (IZO), aluminum doped ZnO (AZO), cadmium zinc oxide (CZO), indium gallium zinc oxide (IGZO), or a combination thereof.

The first electrode PE, the optical layer LC, and the second electrode CE, which are sequentially disposed on the protection layer PL, form the display device DD.

FIGS. 9 to 15 are cross-sectional views showing a method of manufacturing a display apparatus of FIGS. 1 and 2 according to an exemplary embodiment of the present invention.

Figure 9:
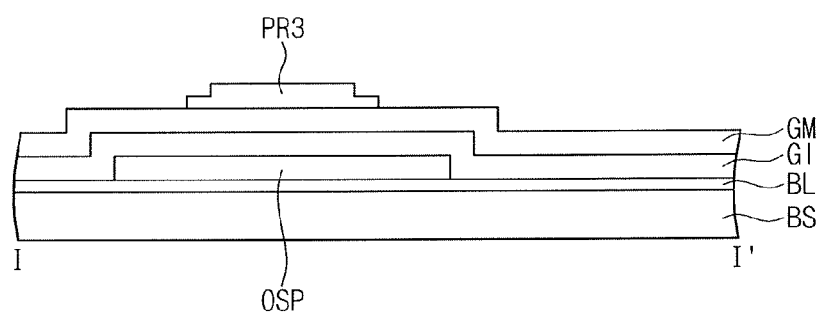
FIGS. 9 to 15 are cross-sectional views showing a method of manufacturing a display apparatus of FIGS. 1 and 2 according to an exemplary embodiment of the present invention.

Referring to FIG. 9, the insulating layer BL is formed on the base substrate BS, and the oxide semiconductor pattern OSP is formed on the insulating layer BL using an oxide semiconductor material. The oxide semiconductor material includes, for example, at least one of Zn, In, Ga, Sn, or mixtures thereof. The oxide semiconductor pattern OSP has a carrier concentration, for example, no greater than about $10^{16}/cm^3$.

After the oxide semiconductor pattern OSP is formed, the gate insulating layer GI is formed to cover the oxide semiconductor pattern OSP and the gate metal layer GM is formed on the gate insulating layer GI.

After the gate metal layer GM is formed, a photoresist pattern PR3 partially overlapped with the oxide semiconductor pattern OSP is formed on the gate metal layer GM. An amount of the light irradiated onto the photoresist pattern PR3 is controlled to allow a thickness at both ends of the photoresist pattern PR3 to be, for example, thinner than a thickness of the center portion thereof.

Figure 10:
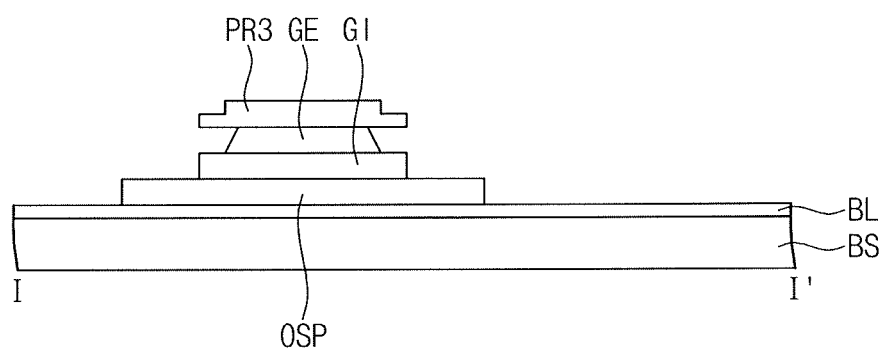

Referring to FIG. 10, after the photoresist pattern PR3 is formed, the gate metal layer GM is, for example, wet-etched to form the gate electrode GE using the photoresist pattern PR3 as a mask. The wet-etching process, for example, is an isotropic etching process, and the size of the gate electrode GE is, for example, smaller than the size of the photoresist pattern PR3.

After the gate electrode GE is formed, the gate insulating layer GI is firstly patterned using, for example, the photoresist pattern PR3 as a mask. The first patterning process is performed using, for example, a dry-etching process. In addition, both ends areas (hereinafter, referred to as first areas) of the oxide semiconductor pattern OSP, which are not overlapped with the photoresist pattern PR3, are exposed by the first patterning process. The dry-etching process is, for example, an anisotropic etching process, and the gate insulating layer GI has, for example, the same shape as the shape of the photoresist pattern PR3. That is, the size of the gate insulating layer GI is, for example, greater than the size of the gate electrode GE.

Also, a thickness of the photoresist pattern PR3 is reduced by the first patterning process. Thus, both ends of the photoresist pattern PR3 are removed, and thus the size of the photoresist pattern PR3 is reduced.

Figure 11:
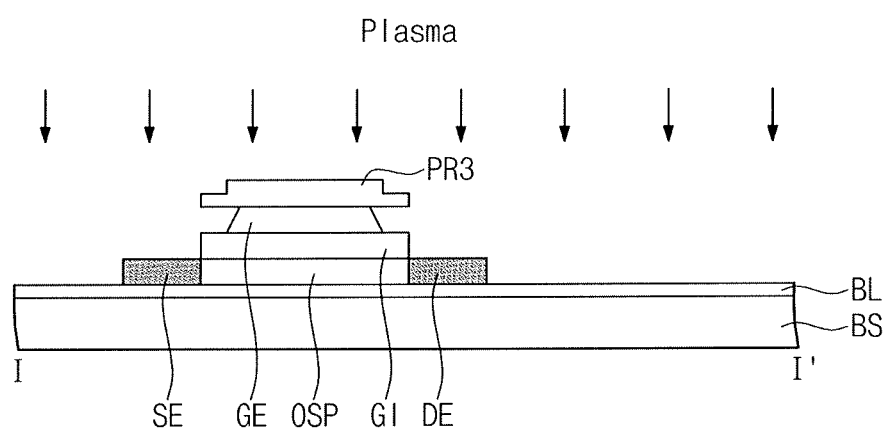

Referring to FIG. 11, after the first patterning process, the first areas are, for example, plasma treated. The carrier concentration of the first areas increases to be in a range of from, for example, about $10^{18}/cm^3$ to about $10^{19}/cm^3$. Thus, the first areas are converted to the source electrode SE and the drain electrode DE by the first plasma treatment. In addition, a size of the oxide semiconductor pattern OSP decreases, and the oxide semiconductor pattern OSP remains in an area between the source electrode SE and the drain electrode DE.

Figure 12:
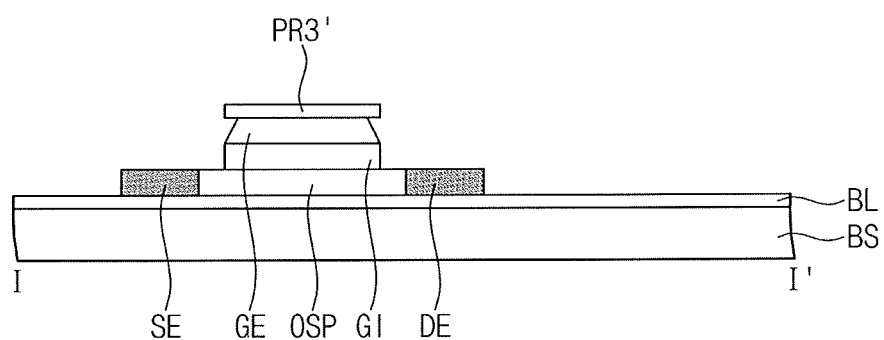

Referring to FIG. 12, after the first plasma treatment, the gate insulating layer GI is secondly patterned using, for example, the photoresist pattern PR3 as a mask. The second patterning process is performed using, for example, a dry-etching process. The dry-etching process is, for example, the anisotropic etching process, and the gate insulating layer GI has, for example, the same shape as the shape of the gate electrode GE by the second patterning process. Thus, areas (hereinafter, referred to as second areas) of the oxide semiconductor pattern OSP, which are not overlapped with the gate electrode GE between the source electrode SE and the drain electrode DE, are exposed by the second patterning process.

Figure 13:
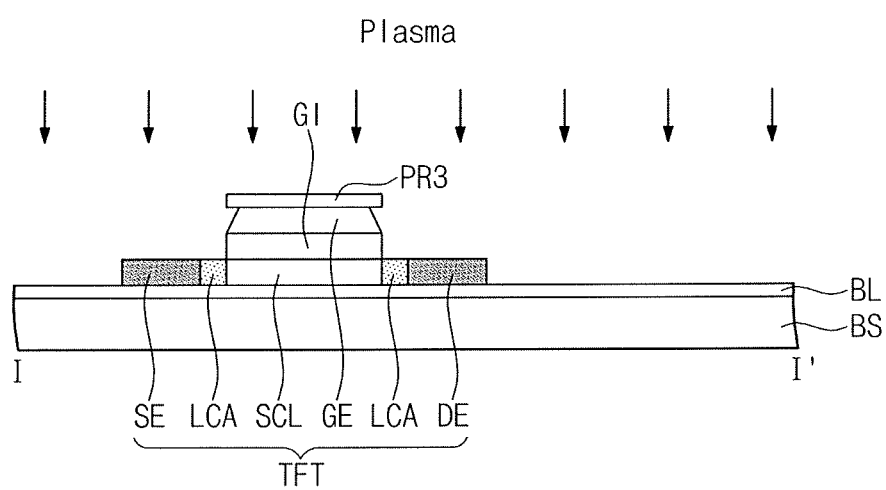

Referring to FIG. 13, after the second patterning process, the source electrode SE, the drain electrode DE, and the second areas are, for example, secondly plasma treated. The carrier concentration of the second areas increases by the second plasma treatment. The carrier concentration of the second areas is, for example, lower than the carrier concentration of the source electrode SE and the drain electrode DE, and the carrier concentration of the second areas is, for example, in a range of from, for example, about $10^{17}/cm^3$ to about $10^{18}/cm^3$. Thus, the second areas are converted to the low carrier concentration areas LCA by the second plasma treatment.

After the second plasma treatment, the photoresist pattern PR3 is removed.

Figure 14:
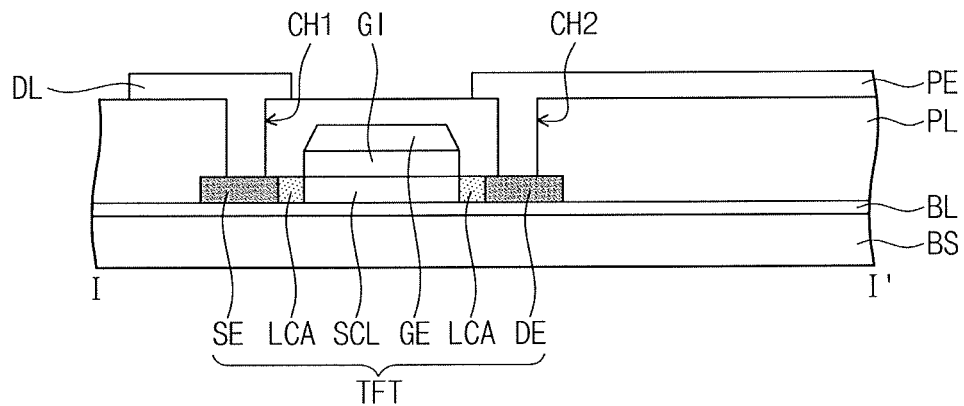

Referring to FIG. 14, after the photoresist pattern PR3 is removed, the protection layer PL is formed to cover the thin film transistor TFT.

After the protection layer PL is formed, the protection layer PL is patterned to form the first contact hole CH1 to expose a portion of the source electrode SE and the second contact hole CH2 to expose a portion of the drain electrode DE.

After the first and second contact holes CH1 and CH2 are formed, a transparent conductive oxide material including, for example, indium tin oxide (ITO), indium zinc oxide (IZO), aluminum doped ZnO (AZO), cadmium zinc oxide (CZO), indium gallium zinc oxide (IGZO), or a combination thereof is deposited on the protection layer PL and patterned to form the data line DL and the first electrode PE. The data line DL makes contact with the source electrode SE through the first contact hole CH1, and the first electrode PE makes contact with the drain electrode DE through the second contact hole CH2.

Figure 15:
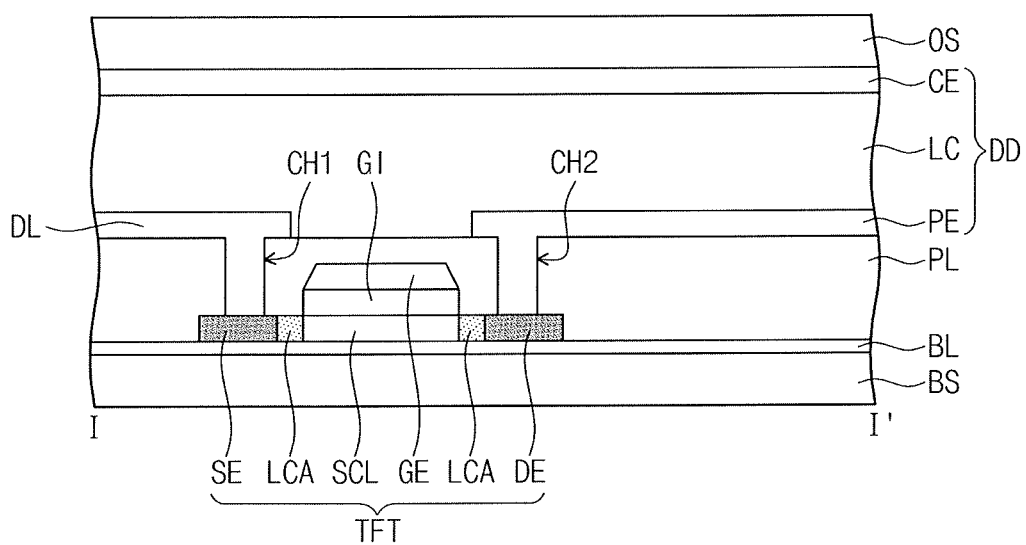

Referring to FIG. 15, after the data line DL and the first electrode PE are formed, the optical layer LC including the liquid crystal molecules is disposed on the data line DL and the first electrode PE.

After the optical layer LC is disposed, the opposite substrate OS is disposed on the optical layer LC. The opposite substrate OS includes the second electrode CE disposed on a surface thereof to face the first electrode PE. Similar to the first electrode PE, the second electrode CE includes, for example, a transparent conductive oxide material including indium tin oxide (ITO), indium zinc oxide (IZO), aluminum doped ZnO (AZO), cadmium zinc oxide (CZO), indium gallium zinc oxide (IGZO), or a combination thereof.

The first electrode PE, the optical layer LC, and the second electrode CE, which are sequentially disposed on the protection layer PL, form the display device DD.

Figure 16:
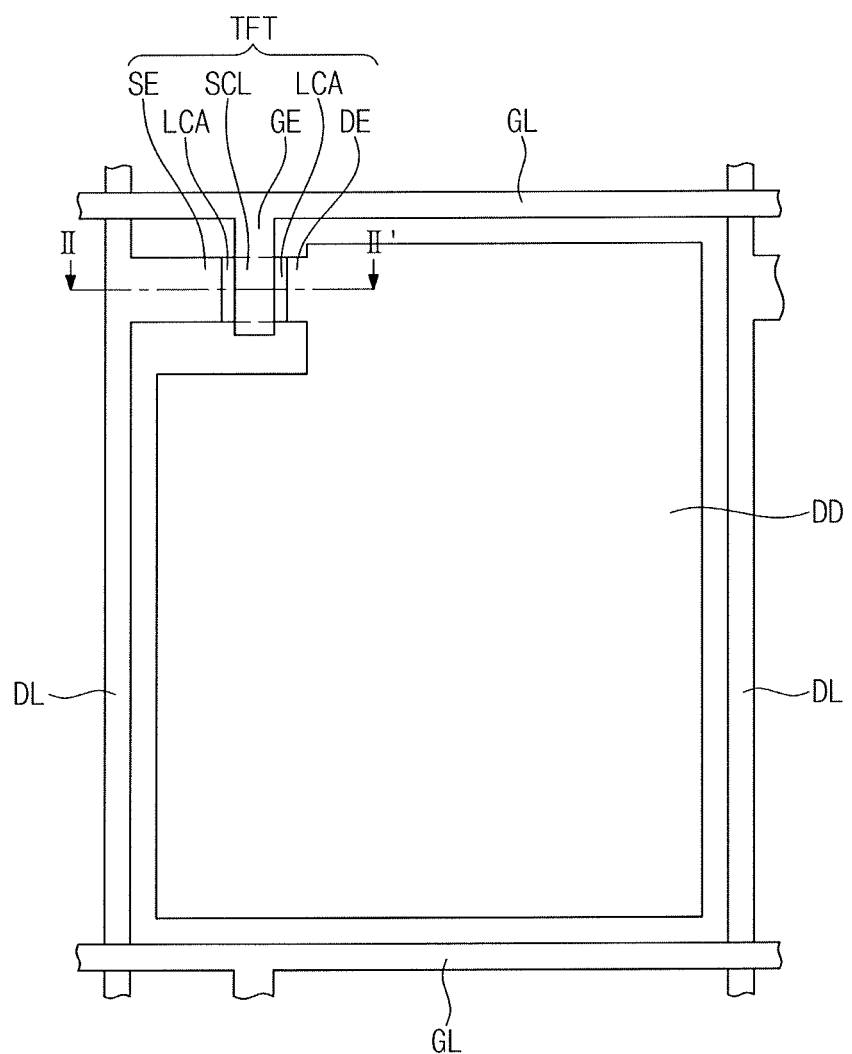
FIG. 16 is a plan view showing a display apparatus according to an exemplary embodiment of the present invention.
Figure 17:
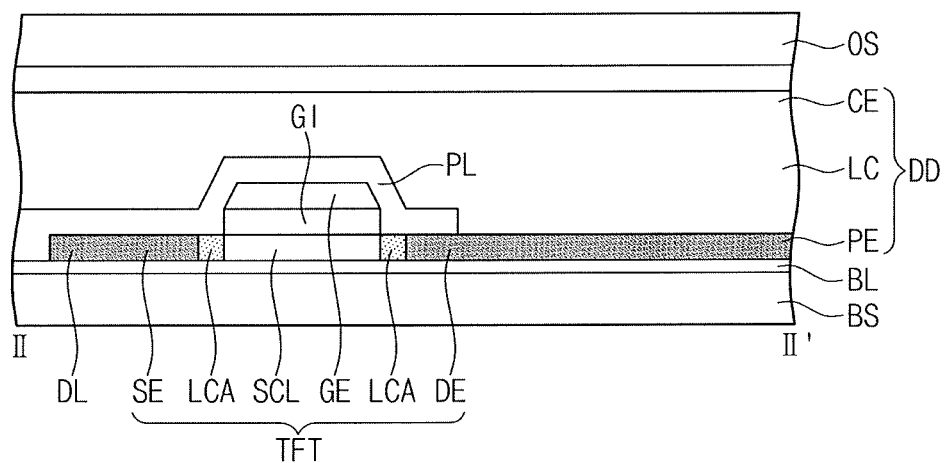
FIG. 17 is a cross-sectional view taken along a line II-II' of FIG. 16.

FIG. 16 is a plan view showing a display apparatus according to an exemplary embodiment of the present disclosure, and FIG. 17 is a cross-sectional view taken along a line II-II' of FIG. 16.

Referring to FIGS. 16 and 17, a display apparatus includes, for example, a base substrate BS, a thin film transistor TFT disposed on the base substrate BS, and a display device DD making contact with the thin film transistor TFT. An insulating layer BL is disposed between the base substrate BS and the thin film transistor TFT.

The thin film transistor TFT includes, for example, a semiconductor layer SCL, a gate electrode GE insulated from the semiconductor layer SCL and overlapped with the semiconductor layer SCL, a source electrode SE and a drain electrode DE, which are extended from both ends of the semiconductor layer SCL, and low carrier concentration areas LCA respectively disposed between the source electrode SE and the semiconductor layer SCL and between the drain electrode DE and the semiconductor layer SCL.

The semiconductor layer SCL is disposed on the insulating layer BL. The semiconductor layer SCL includes, for example, at least one of Zn, In, Ga, Sn, or a mixture thereof.

The source electrode SE, the drain electrode DE, and the low carrier concentration areas LCA are formed of, for example, the same material as the material of the semiconductor layer SCL.

In addition, a carrier concentration of the source electrode SE, the drain electrode DE, and the low carrier concentration areas LCA is, for example, higher than a carrier concentration of the semiconductor layer SCL. The carrier concentration of the source and drain electrodes SE and DE is, for example, higher than a carrier concentration of the low carrier concentration areas LCA. For example, the carrier concentration of the semiconductor layer SCL is no greater than about $10^{16}/cm^3$, the carrier concentration of the low carrier concentration areas LCA is in a range of from about $10^{17}/cm^3$ to about $10^{18}/cm^3$, and the carrier concentration of the source electrode SE and the drain electrode DE is in a range of from about $10^{18}/cm^3$ to about $10^{19}/cm^3$.

Further, a width of the low carrier concentration areas LCA, that is, a distance between the source and drain electrodes SE and DE and the semiconductor layer SCL is in a range of from, for example, about 0.5 μm to about 2 μm.

One end of the source electrode SE is extended to be connected to the data line DL, and one end of the drain electrode DE is extended to be connected to the first electrode PE of the display device DD. That is, the source electrode SE, the drain electrode DE, the low carrier concentration areas LCA, the semiconductor layer SCL, the data line DL, and the first electrode PE include, for example, the same material as one another and are arranged on the same layer as one another.

The gate insulating layer GI is disposed on the semiconductor layer SCL to insulate the semiconductor layer SCL from the gate electrode GE.

The gate electrode GE is disposed on the gate insulating layer GI and overlapped with the semiconductor layer SCL. The gate electrode GE makes contact with the gate line GL extended in one direction.

The protection layer PL is disposed on the thin film transistor TFT, and the protection layer PL exposes a portion of the first electrode PE.

The display device DD includes, for example, the first electrode PE, the second electrode CE facing the first electrode PE, and the optical layer LC interposed between the first electrode PE and the second electrode CE.

The second electrode CE includes, for example, the transparent conductive oxide material, such as indium tin oxide (ITO), indium zinc oxide (IZO), aluminum doped ZnO (AZO), cadmium zinc oxide (CZO), indium gallium zinc oxide (IGZO), or a combination thereof. Also, the second electrode CE is disposed on a surface of the opposite substrate OS, which faces the base substrate BS.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A thin film transistor comprising:
   a semiconductor layer disposed on a base substrate and including an oxide semiconductor material;
   a source electrode and a drain electrode, which respectively extend from opposing ends of the semiconductor layer;
   a first low carrier concentration area disposed between the source electrode and the semiconductor layer;
   a second low carrier concentration area disposed between the drain electrode and the semiconductor layer;
   a gate insulating layer disposed on the semiconductor layer; and a gate electrode disposed on the gate insulating layer,
wherein the first and second low carrier concentration areas have a carrier concentration greater than a carrier concentration of the semiconductor layer and the first and second low carrier concentration areas have a carrier concentration less than that of the source and drain electrodes.

2. The thin film transistor of claim 1, wherein the source electrode, the drain electrode, and the low carrier concentration areas comprise a same material as a material of the semiconductor layer, and wherein the oxide semiconductor material includes at least one of zinc, indium, gallium, tin, or a mixture thereof.

3. The thin film transistor of claim 2, wherein each of the low carrier concentration areas has a width in a range of from about 0.5 μm to about 2 μm.

4. The thin film transistor of claim 1 wherein the carrier concentration of the low carrier concentration areas is in a range of from about $10^{17}/cm^3$ to about $10^{18}/cm^3$, the carrier concentration of the semiconductor layer is no greater than about $10^{16}/cm^3$, and the carrier concentration of the source and the drain electrodes is in a range of from about $10^{18}/cm^3$ to about $10^{19}/cm^3$.

5. A display apparatus comprising:
a base substrate;
a thin film transistor disposed on the base substrate; and
a display device that makes contact with the thin film transistor, wherein the thin film transistor comprises:
a semiconductor layer disposed on the base substrate and including an oxide semiconductor material,
a source electrode and a drain electrode, which respectively extend from opposing ends of the semiconductor layer,
a first low carrier concentration area disposed between the source electrode and the semiconductor layer, and
a second low carrier concentration area disposed between the drain electrode and the semiconductor layer;
a gate insulating layer disposed on the semiconductor layer; and
a gate electrode disposed on the gate insulating layer,
wherein the first and second low carrier concentration areas have a carrier concentration greater than a carrier concentration of the semiconductor layer and the first and second low carrier concentration areas have a carrier concentration less than that of the source and drain electrodes.

6. The display apparatus of claim 5, wherein the display device comprises:
a first electrode making contact with the drain electrode;
a second electrode facing the first electrode; and
an optical layer interposed between the first electrode and the second electrode.

7. The display apparatus of claim 6, wherein the source electrode, the drain electrode, and the low carrier concentration areas comprise a same material as a material of the semiconductor layer, and wherein the oxide semiconductor material comprises at least one of zinc, indium, gallium, tin, or a mixture thereof.

8. The display apparatus of claim 5, wherein each of the low carrier concentration areas has a width from about 0.5 μm to about 2 μm.

9. The display apparatus of claim 6, further comprising:
a protection layer that covers the thin film transistor and includes a first contact hole exposing a portion of the source electrode and a second contact hole exposing a portion of the drain electrode; and
a data line disposed on the protection layer making contact with the source electrode through the first contact hole, wherein the first electrode makes contact with the drain electrode through the second contact hole.

10. The display apparatus of claim 6, further comprising a data line extending from the source electrode, wherein the first electrode extends from the drain electrode.

11. The display apparatus of claim 10, further comprising a protection layer covering the thin film transistor and exposing the first electrode.

12. The display apparatus of claim 5, further comprising an insulating layer interposed between the base substrate and the thin film transistor.

13. The display apparatus of claim 9, wherein the protection layer includes an inorganic protection layer and an organic protection layer disposed on the inorganic protection layer, wherein the inorganic protection layer includes at least one of silicon oxide or silicon nitride, and wherein the organic protection layer includes one of acryl, polyimide, polyamide, or benzocyclobutene.

14. A display apparatus comprising:
a base substrate;
a thin film transistor disposed on the base substrate;
a display device that makes contact with the thin film transistor, wherein the thin film transistor comprises:
a semiconductor layer disposed on the base substrate and including an oxide semiconductor material,
a source electrode and a drain electrode, which respectively extend from opposing ends of the semiconductor layer, and
a plurality of low carrier concentration areas respectively disposed between the source electrode and the semiconductor layer and between the drain electrode and the semiconductor layer;
a gate insulating layer disposed on the semiconductor layer;
a gate electrode disposed on the gate insulating layer,
wherein the display device comprises:
a first electrode making contact with the drain electrode,
a second electrode facing the first electrode, and
an optical layer interposed between the first electrode and the second electrode;
a data line extending from the source electrode, wherein the first electrode extends from the drain electrode; and
a protection layer covering the thin film transistor and exposing the first electrode,
wherein the protection layer includes an inorganic protection layer and an organic protection layer disposed on the inorganic protection layer, wherein the inorganic protection layer includes at least one of silicon oxide or silicon nitride, and wherein the organic protection layer includes one of acryl, polyimide, polyamide, or benzocyclobutene.

15. The display apparatus of claim 9, wherein the first electrode is disposed on a same layer as the data line and includes a same material as a material of the data line.

* * * * *